United States Patent [19]
Lu

[11] Patent Number: 6,127,071
[45] Date of Patent: Oct. 3, 2000

[54] SERIF MASK DESIGN FOR CORRECTING SEVERE CORNER ROUNDING AND LINE END SHORTENING IN LITHOGRAPHY

[75] Inventor: Ning Lu, Essex Junction, Vt.

[73] Assignee: International Business Machines Corporation, Armonk, N.Y.

[21] Appl. No.: 09/338,244

[22] Filed: Jun. 22, 1999

[51] Int. Cl.$^7$ .................................................. G03F 9/00
[52] U.S. Cl. .................................................. 430/5; 430/30
[58] Field of Search ............................................ 430/5, 30

[56] References Cited

U.S. PATENT DOCUMENTS

| | | | |
|---|---|---|---|
| 5,663,893 | 9/1997 | Wampler et al. | 364/491 |
| 5,705,301 | 1/1998 | Garza et al. | 430/5 |
| 5,707,765 | 1/1998 | Chen | 430/5 |
| 5,723,233 | 3/1998 | Garza et al. | 430/5 |
| 5,801,954 | 9/1998 | Le et al. | 364/488 |
| 5,851,702 | 12/1998 | Watanabe et al. | 430/5 |

FOREIGN PATENT DOCUMENTS

| | | |
|---|---|---|
| 6-242595 | 9/1994 | Japan . |
| 8-15853 | 1/1996 | Japan . |

*Primary Examiner*—Christopher G. Young
*Attorney, Agent, or Firm*—Scully, Scott, Murphy & Presser; William D. Sabo, Esq.

[57] ABSTRACT

A photolithographic mask for conducting illumination from a light source onto a semiconductor surface during a microlithographic manufacturing process. The mask includes a line end portion of a width w and including two corners, each corner defining a respective region for locating one or more serifs for correcting severe corner rounding and line end foreshortening effects caused by the optical diffraction during the optical imaging process. For aerial image/resist pattern modeled as a convolution or the square of a convolution between the photomask and an intensity/amplitude kernel function having an effective range r in x and y directions, and under a condition that w<r<2w, a hanging square serif of a size w×w is provided attached to a respective corner within a corner region. For the condition of $2nw<r\leq2(n+1)w$, with n=1, 2, . . . , each corner region includes an associated (n+1) serifs, each being linearly aligned along line-end extension line and spaced apart from an adjacent serif by a distance w, with each of the first n serifs being square and of a width w, and the $(n+1)^{th}$ serif being a rectangle of a length w and a width min(r−2nw, w). When the intensity/amplitude kernel function is modeled as being azimuthal-angle independent and being non-zero over a circular area of radius r, which is typical for usual circular aperture, the serif size in the corner regions may be optimized. For a hanging square serif of size w×w under the condition w<r≤2w, if further w<r<√2 w, then the hanging serif in each corner region may be reduced in size without altering the aerial image/resist pattern intensity at its respective corner. The portion of the square serif to be removed is that portion of the square which is outside the circular intensity/amplitude kernel function of radius r centered at its respective corner. For a set of associated (n+1) serifs under a condition $2nw<r\leq2(n+1)w$, if further $[(2n+1)^2+1]^{1/2} w\leq r \leq 2(n+1)w$, with n=1, 2, . . . , then the $(n+1)^{th}$ serif in each corner region may be reduced in size without altering the aerial image/resist pattern intensity at its respective corner. The portion of the $(n+1)^{th}$ serif to be removed is that portion of the rectangle which is outside the circular intensity/amplitude kernel function of radius r centered at its respective corner.

27 Claims, 10 Drawing Sheets

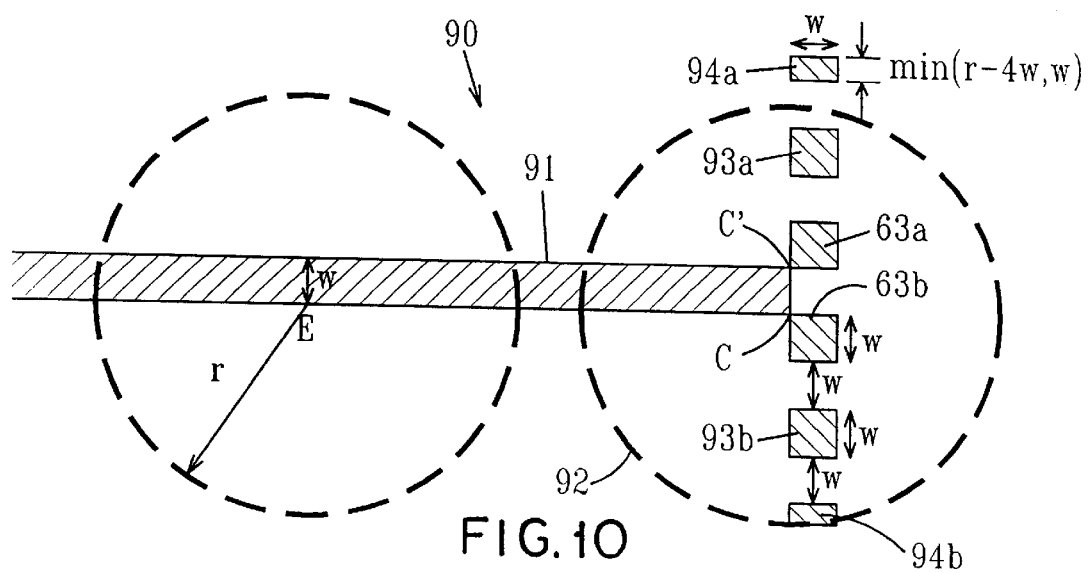
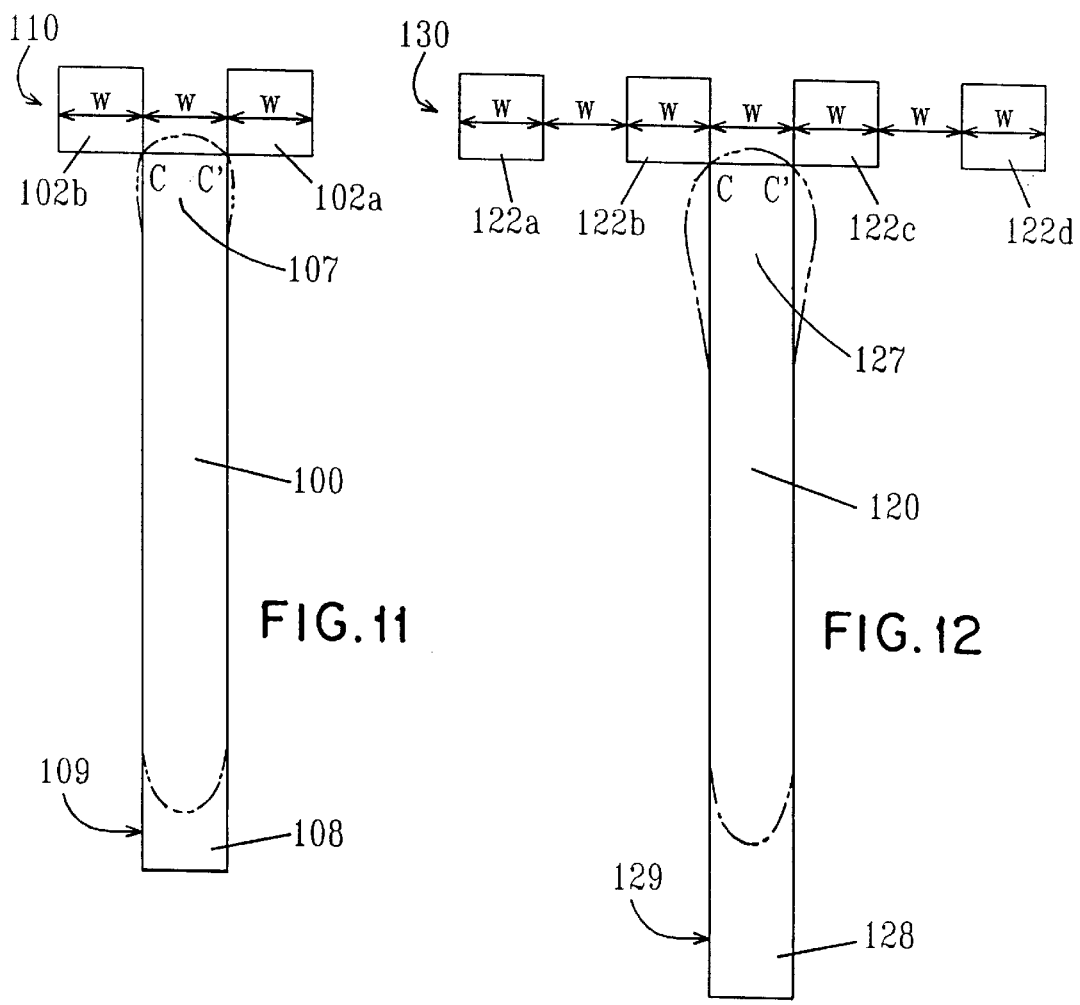
FIG. 10
FIG. 11
FIG. 12

SERIF MASK DESIGN FOR CORRECTING SEVERE CORNER ROUNDING AND LINE END SHORTENING IN LITHOGRAPHY

BACKGROUND OF THE INVENTION

1. Field of the Invention

The present invention relates for microlithographic technology and, particularly, to techniques implementing serifs for correcting severe optical proximity effects in microlithography.

2. Discussion of the Prior Art

Photolithography is the technology of reproducing patterns using light. As presently used in semiconductor industry, a photomask pattern for a desired circuit is transferred to a wafer through light exposure, development, etch, and resist strip, etc. As feature sizes on a circuit become smaller and smaller, the circuit shape on the wafer differs from the original mask pattern more and more. In particular, optical proximity effect phenomena such as corner rounding, line end foreshortening, iso-dense print bias, etc., are typically observed.

FIG. 1 illustrates a rectangular mask 10 and corresponding aerial image (after light exposure) of the final photoresist pattern 10' (indicated as broken lines) after further development, etch, and resist strip, etc. As shown in FIG. 1, the optical proximity effect of corner rounding is clearly exhibited as indicated at corners 12a–12d.

A simple geometric picture for understanding the optical proximity effects, such as the corner rounding, is additionally shown in FIG. 1. For definiteness, it is assumed that the clear region 10 of the mask portion 8 is inside the mask and serif boundaries.

For the case of incoherent light illumination (using either circular or rectangular aperture), the aerial image intensity at a point "E" is given by the convolution between the intensity kernel function and the transmitted light intensity around the point, and is proportional to the volume of a truncated cone-type 3D structure 15a (for the case of a square or rectangular aperture), and at a point "E'" by a truncated cone-type 3D structure 15b (for the case of a circular aperture), as shown in FIG. 1. Each whole cone-type structure 15a, 15b represents the intensity kernel function on a respective 2D region centered at a point E (E') and has an effective range (radius) "r" which is basically the range of inference due to the optical proximity effects. In terms of the optical wavelength "λ" and the numerical aperture NA, the effective range "r" is of the order λ/NA. The truncation is done according to the actual light transmission around that point, which may be blocked by any opaque region 20 in the photomask, e.g., resulting in a half-rectangle region or a half-circle region. That is, as shown in FIG. 1, for an edge point E (when its distance to its nearest corner is larger than r), after truncation, the 2D area becomes rectangle represented by the half-square region 16a, i.e., its volume is half of whole volume under the intensity kernel function (i.e., half of whole volume of 3D cone-type structure for the case of a square or rectangular aperture). Similarly, for an edge point E', after truncation, the 2D area becomes a half-circle region 16b (for the case of a circular aperture). Moreover, as shown in FIG. 1, for a corner point "C," after truncation, its volume 18a is one quarter (¼) of whole volume under the intensity kernel function (for the case of a square or rectangular aperture) and similarly, for a corner point C', the volume 18b is one quarter (¼) of whole volume under the intensity kernel function (for the case of a circular aperture).

Thus, $I_C = I_E/2$, with $I_C$ representing an illumination intensity at point C and $I_E$ representing an intensity at point E, independent of the range r and the form of the intensity kernel function. The aerial intensity contour line passing through the edge point E will not pass through the corner point C; rather, it passes through an inner point, resulting in the corner rounding effects.

For the case of coherent light illumination (with either circular or rectangular aperture), the aerial image intensity at a point is given by the square of the convolution between the amplitude kernel function and the actual transmitted light amplitude, and is proportional to the square of the volume of a truncated cone-type 3D structure. The whole cone-type structure represents the amplitude kernel function on a 2D region and is centered at that point and has a horizontal range r. In this instance, the truncation is also done according to the actual light transmission around that point, which may be blocked by any opaque region in the photomask. For an edge point E (when its distance to its nearest corner is larger than r), after truncation, its volume is half of whole volume under the amplitude kernel function (i.e., one-half of whole volume 3D cone-type structure). For a corner point C, after cut, its volume is one quarter (¼) of whole volume under the amplitude kernel function. Thus, it is the case that $I_C = I_E/4$, also independent of the range r and the form of the amplitude kernel function. Here, 4 comes from the square of 2. The aerial intensity contour curve passing through the edge point E will not pass through the corner point C; rather, it passes through an inner point. Consequently, the corner rounding also exists for the coherent illumination.

For partially coherent light illumination, the corner rounding can be understood qualitatively: the light contribution to a corner point C' comes from within a quarter circle region of radius r (for circular aperture), e.g., at corner 12d (FIG. 1) which is less than the contribution of an edge point E coming from within a half-circle region of radius r; for a square aperture, it is from within a square region of length r, e.g., at corner 12b (FIG. 1) which is less than the contribution of an edge point E coming from within a rectangle of a size 2r×r. It is readily understood that a partial coherent illumination with large coherence factor "σ" may be approximated as an incoherent illumination. Likewise, a partial coherent illumination with small coherence factor "σ" may be treated as a coherent illumination.

Line end shortening can be understood similarly based on the geometric representations depicted in FIG. 1.

One of main reasons for optical proximity effects is light diffraction. Optical proximity effects coming from light diffraction may be overcome partly by using a shorter wavelength light source, and, with a projection system possessing a larger numerical aperture. In practice, the wavelength of an optical light source is typically fixed (365 nm, 248 nm, 193 nm, etc.) and there is a practical upper limit on numerical aperture. So other resolution enhancement methods, including the use of phase-shifting masks and masks with serifs, have been developed to correct optical proximity effects.

When optical proximity effects are not severe, both corner rounding and line end shortening can be corrected completely with the use of hanging serifs. This has been disclosed in detail in commonly-owned, co-pending U.S. patent application Ser. No. 09/167,948 entitled SERIF MASK DESIGN METHODOLOGY BASED ON ENHANCING HIGH SPATIAL FREQUENCY CONTRIBUTION FOR IMPROVED PRINTABILITY" the contents and drawings of which are wholly incorporated by reference as if fully set forth herein. U.S. Pat. No. 5,707,765 describes further techniques implementing serifs for correcting optical proximity effects in microlithographic circuits.

FIG. 2(a) depicts a serif design 28 in a photomask line end portion 21 for illumination by means including a square aperture and when the kernel function's range r is less than or equal to the pattern line width w, i.e., r≦w. Within the intensity/amplitude kernel function representation at respective square regions 22a, . . . ,22d in FIG. 2(a), different truncations still lead to the same total volume of 3D cone structure resulting in $I_E=I_C=I_S=I_N$ where $I_S$ is the illumination (aerial) intensity at point S and $^1$N is the illumination intensity at point N for both incoherent and coherent light illuminations. Thus, hanging square serifs 23a, . . . ,23d each of size r×r work ideally when r≦w.

FIG. 2(b) similarly depicts a serif design 29 in a photomask line end portion 27 for illumination by means including a circular aperture and when the kernel function's radius r is not larger than the wire width "w", i.e., r≦w. Within the intensity/amplitude kernel function representations at respective circular regions 24a, . . . ,24d in FIG. 2(b), different truncations still lead to the same total volume of 3D cone structure, i.e., $I_E=I_C=I_S=I_N$ for both incoherent and coherent light illuminations. Thus, hanging quarter-circle serifs 25a, . . . ,25d of radius r serifs work ideally when r≦w.

When optical proximity effects are severe (i.e., big corner rounding and large amount of foreshortening), the prior art serif mask designs (shown in FIGS. 2(a) and 2(b)) no longer work satisfactorily. These severe optical proximity effects occur when the kernel function's range r is larger than wire width w, which represents the typical feature size, i.e., patterned line width.

FIG. 3(a) depicts a serif design 30 in a photomask line end portion 31 for illumination by means including a square aperture when the kernel function's range r becomes larger than the line width w, i.e., r>w. Now the masked areas (or unmasked areas) within 2D kernel representations 32a,32b in FIG. 3(a) are no longer equal, resulting in an unequal intensity relation $I_E \neq I_C$. Thus, hanging square serifs 33a,b, of size r×r no longer provides desired results on aerial image/resist pattern when r<w.

FIG. 3(b) depicts a serif design 35 in a photomask line end portion 38 for illumination by means including a circular aperture when the kernel function's radius r becomes larger than the line width w, i.e., r>w. Here, the mask areas (or unmasked areas) within 2D kernel representations 36a, 36b in FIG. 3(b) becomes unequal, resulting in an unequal intensity relation $I_E \neq I_C$. Consequently, hanging quarter-circle serifs 37a, 37b of radius r no longer provides desired results for optical proximity correction (OPC) when r>w.

It would be highly desirable to provide a serif mask design for photolithographic mask that sufficiently corrects severe line end foreshortening and corner rounding effects for situations whereby the illumination kernel function's effective range (or radius) r is larger than the patterned line width w.

SUMMARY OF THE INVENTION

It is an object of the present invention to provide a photomask structure for correcting severe corner rounding and severe line end shortening effects in microlithography. Preferably, the photomask of the invention is designed to address the situation of r>w, where w is the line or wire width (typical feature size), and r is the kernel function's effective range. Namely, in a local coordinate system which centers at a point under consideration for calculating its aerial image, the kernel function K is substantially zero when its argument is larger than r: K(x,y)=0 when |x|>r and/or |y|>r, for a square aperture and, in terms of polar coordinates (ρ, φ), and K(ρ)=0 when ρ>r for a circular aperture. For incoherent light illumination, r may be the range of the combined kernel function for both optical imaging process (which leads to aerial image) and subsequent etch and resist development processes (assumed to be a convolution process, e.g., a simple diffusion process), in which case the intensities $I_E$ and $I_C$ represent final resist pattern.

According to the principles of the invention, there is provided a photolithographic mask for conducting a light source onto a semiconductor surface during a photolithographic imaging process, the mask including a line end portion for illumination by the light source, the line end portion of a width w and including two corners each defining a respective region for locating one or more serifs therein for correcting severe corner rounding and line end foreshortening effects caused by optical diffraction during the photolithographic process, wherein the aerial image/resist pattern of an imaging system having a square/circular aperture is modeled as a convolution or the square of a convolution between the photomask and an intensity/amplitude kernel function having an effective range r in x and y directions, a design whereby under a condition that w<r<=2w, a hanging square serif of a size w×w is provided attached to a respective corner within a corner region. For the condition of 2nw 21 r≦2(n+1)w, with n=1, 2, . . . , each corner region includes an associated (n+1) serifs, each being linearly aligned along line-end extension line and spaced apart from an adjacent serif by a distance w, with each of the first n serifs being square and of a width w, and the (n+1)$^{th}$ serif being a rectangle of a length w and a width min(r−2nw, w).

When an imaging system including a circular aperture is implemented during photolithographic process, it may be represented as providing an effective intensity/amplitude kernel function represented as a circle of radius r, enabling the serif size in the corner regions to be optimized. For a hanging square serif of size w×w under the condition w<r≦2w mentioned above, if further w<r<√2 w, then circular intensity/amplitude kernel function of radius r centered at its respective wire corner intersects the hanging square serif of size w×w. Consequently, the hanging serif in each corner region may be reduced in size without altering the aerial image/resist pattern intensity at its respective corner. The portion of the square serif to be removed is that portion of the square which are outside the circular intensity/amplitude kernel function of radius r centered at its respective corner. For a set of associated (n+1) serifs under a condition 2nw<r≦2(n+1)w mentioned above, if further 2nw<r<[(2n+1)$^2$+1]$^{1/2}$w, with n=1, 2, . . . , then circular intensity/amplitude kernel function of radius r centered at its respective wire corner intersects the (n+1)$^{th}$ rectangular serif, which is the most outside one among (n+1) serifs. Thus, the (n+1)$^{th}$ serif in each corner region may be reduced in size without altering the aerial image/resist pattern intensity at its respective corner. The portion of the (n+1)$^{th}$ serif to be removed is that portion of the rectangle which are outside the circular intensity/amplitude kernel function of radius r centered at its respective corner. On the other hand, if further [(2n+1)$^2$+1]$^{1/2}$ w≦r≦2(n+1)w, with n=1, 2, . . . , then the (n+1)$^{th}$ serif is not intersected by the circular intensity/amplitude kernel function and thus there is no removal of part of the (n+1)$^{th}$ serif.

BRIEF DESCRIPTION OF THE DRAWINGS

Further features, aspects and advantages of the apparatus and methods of the present invention will become better understood with regard to the following description, appended claims, and accompanying drawings where:

FIG. 10 depicts a serif design for a photomask line end portion to be illuminated by means including a circular aperture for the case where 4w<r<√26 w.

FIG. 11 illustrates a resultant aerial image/photoresist pattern for the serif mask design embodiment where w<r>2w.

FIG. 12 illustrates a resultant aerial image/photoresist pattern for the serif mask design embodiment where 2w<r≦4w.

DETAILED DESCRIPTION OF THE PREFERRED EMBODIMENTS

For the case of a square aperture, the following symmetry properties usually exist:

$$K(x,y)=K(|x|,|y|)=K(y,x)$$

where K is the kernel function defined herein, and x=y=0 is the center of the kernel function.

Figure 1:
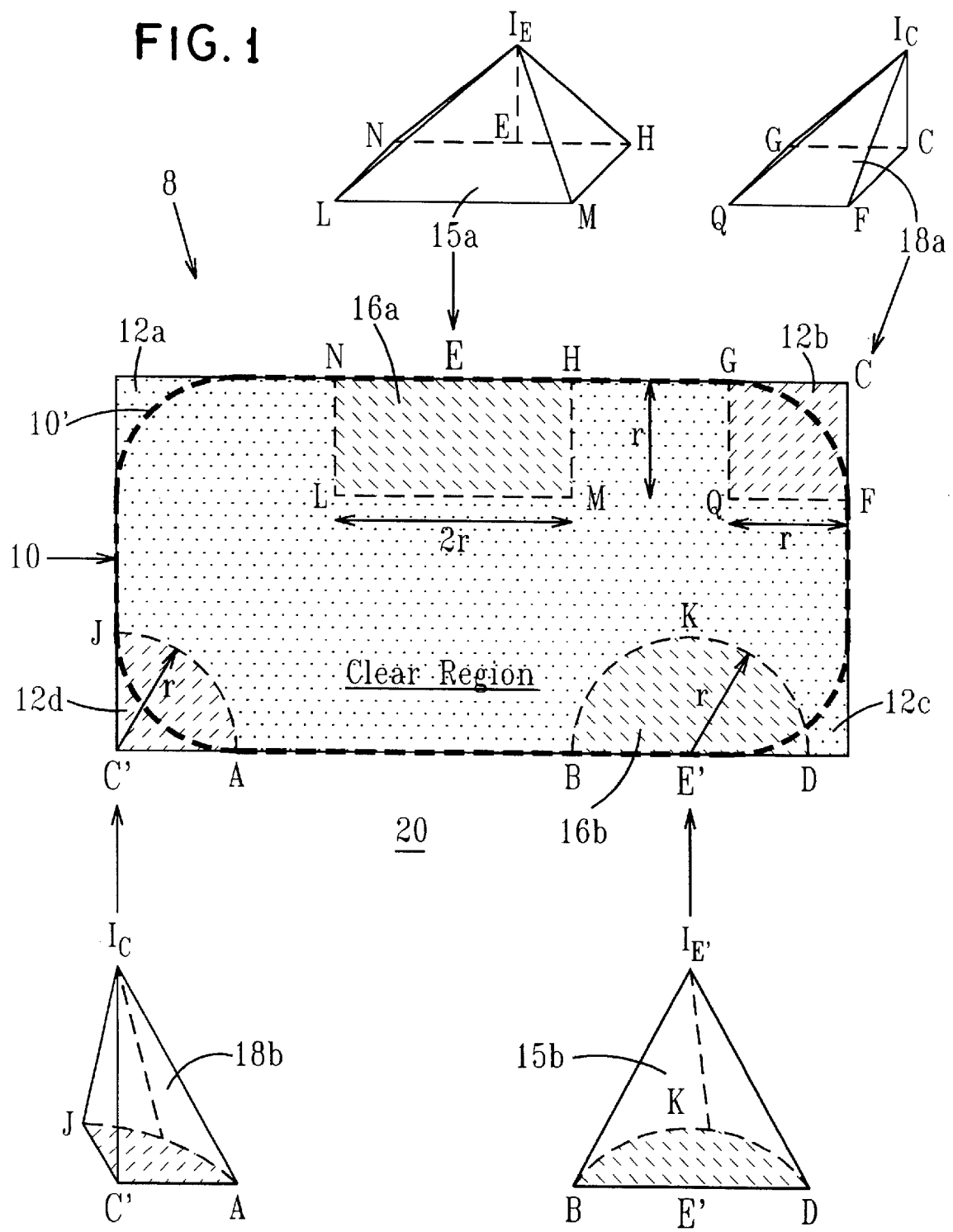
FIG. 1 illustrates a rectangular mask and corresponding aerial image (after light exposure) or the final photoresist pattern after further development, etch, and resist strip, etc. (indicated as broken lines).
Figure 2A:
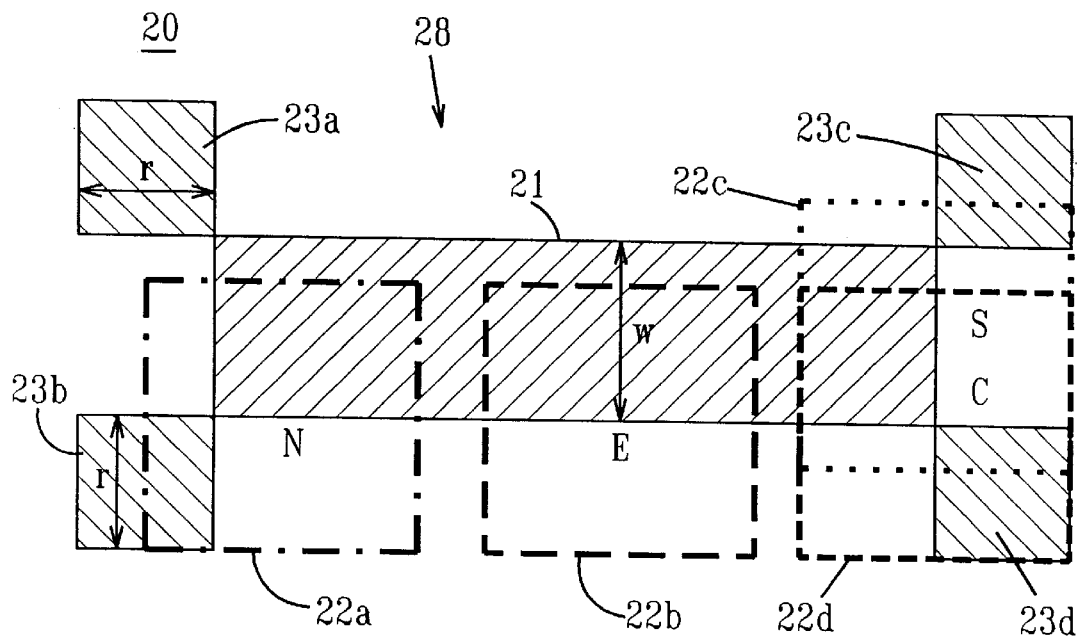
FIGS. 2(a) and 2(b) depict a serif design in a mask portion for illumination by means including a square aperture (FIG. 2(a)) and circle aperture (FIGS. 2(b)) and when the kernel function's range r is less than or equal to the pattern line width w.
Figure 2B:
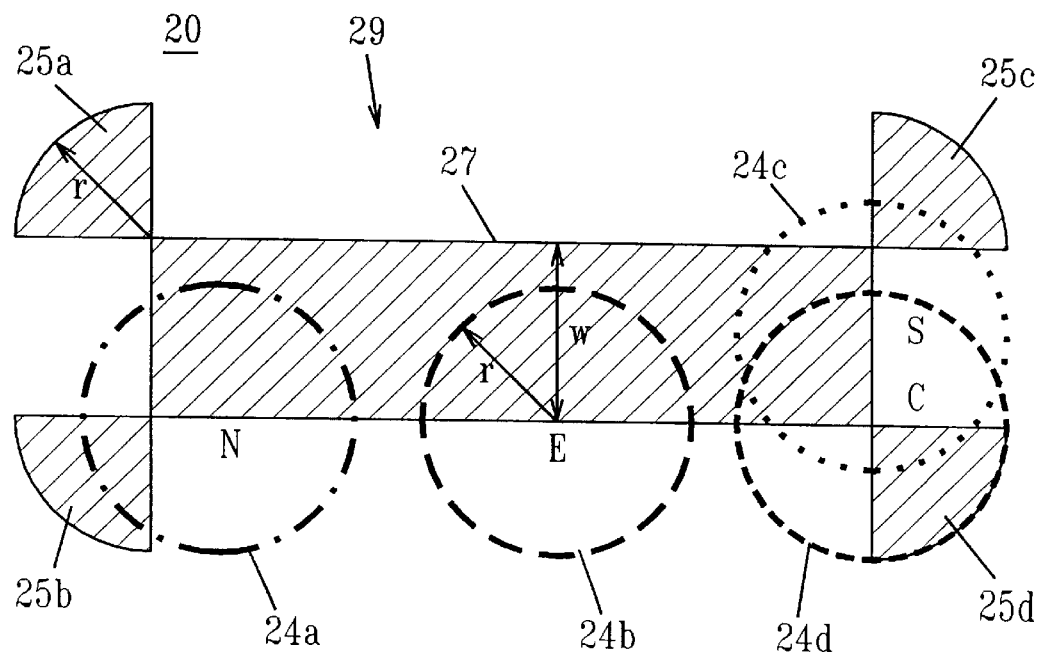
Figure 3A:
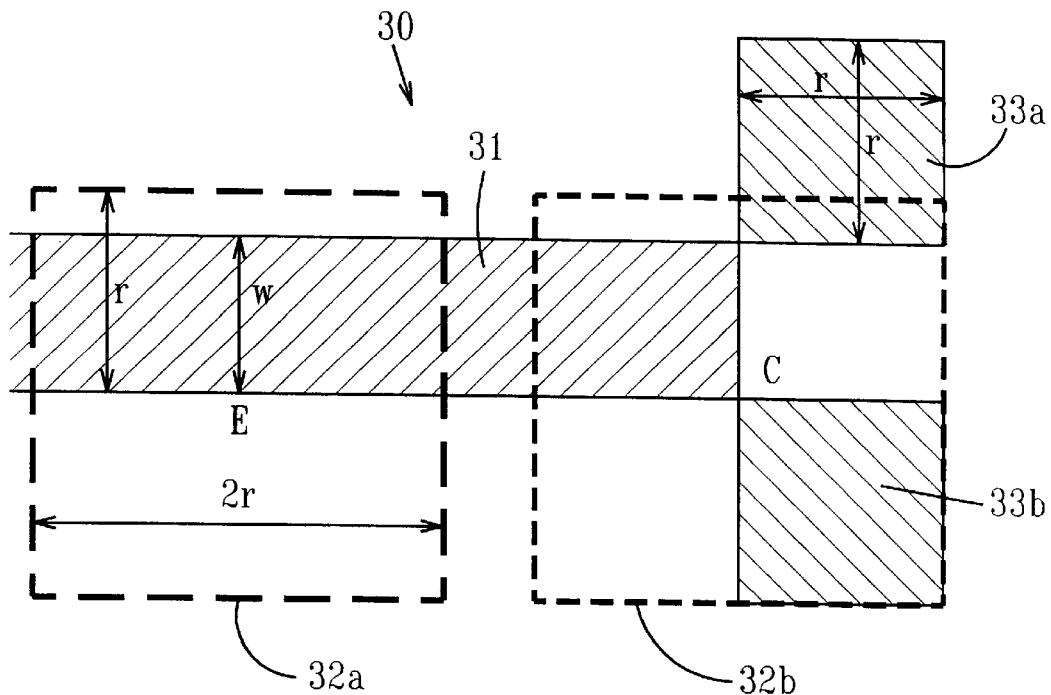
FIGS. 3(a) and 3(b) depict a serif design in a mask portion for illumination by means including a square aperture (FIG. 3(a)) and circle aperture (FIG. 3(b)) and when the kernel function's range r becomes larger than the pattern line width w.
Figure 3B:
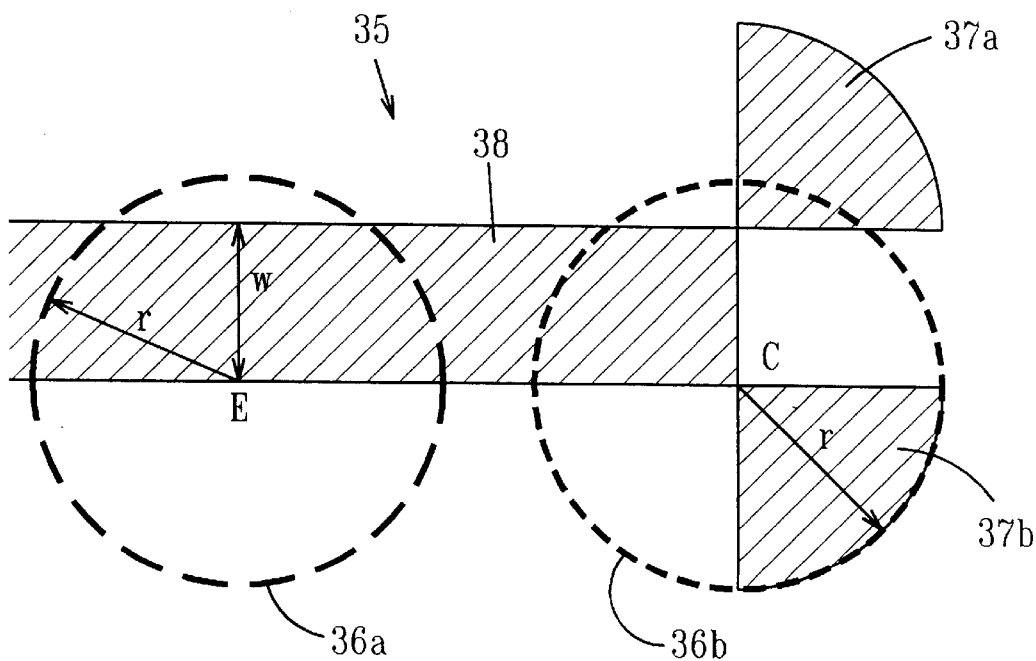
Figure 4A:
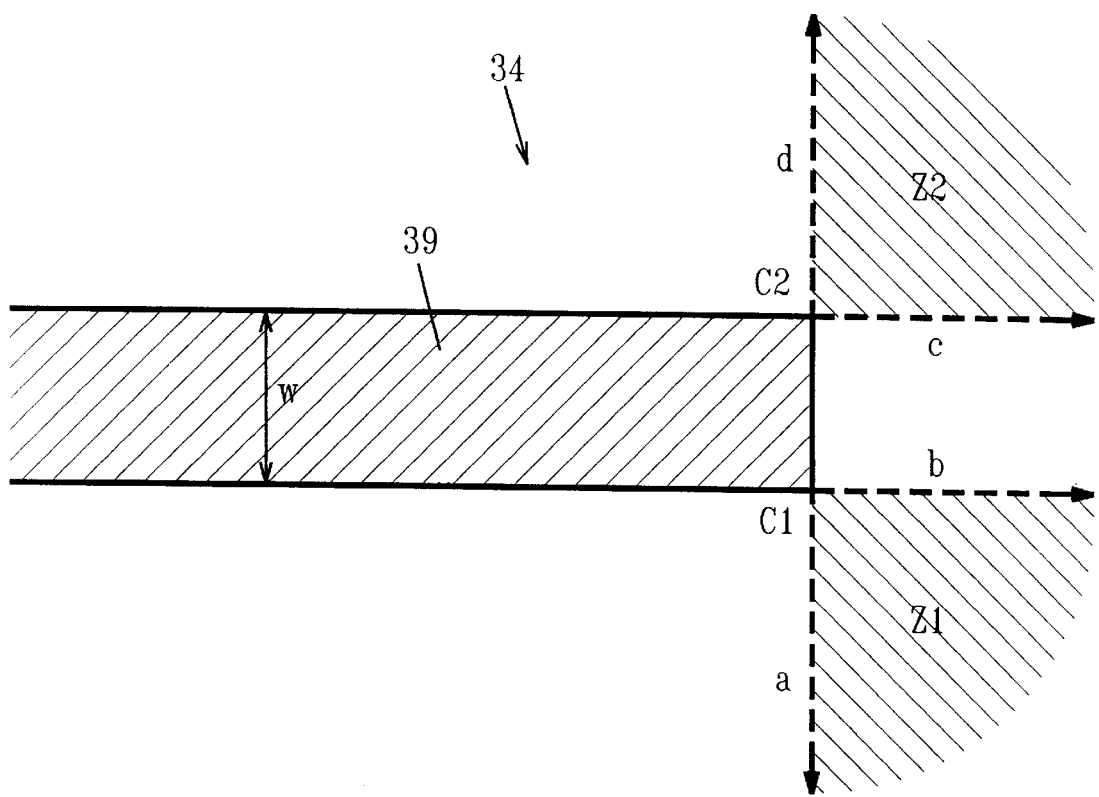
FIG. 4(a) depicts conceptually the serif mask design range for a photolithographic mask line end portion according to the invention.

FIG. 4(a) depicts conceptually the serif mask design 34 for a photolithographic mask line end portion 39 of width w having corners C1 and C2, with a corner C1 having extension lines a and b (indicated as broken lines) and defining a region Z1, and a corner C2 having extension lines c and d (indicated as broken lines) and defining a region Z2. Region Z1 is the corner region for corner C1, and region Z2 is the corner region for corner C2. The extension lines a and d are called line-end extension lines. As will be explained in greater detail hereinbelow, regions Z1 and Z2 include all the serifs according to the embodiments of invention.

Figure 4B:
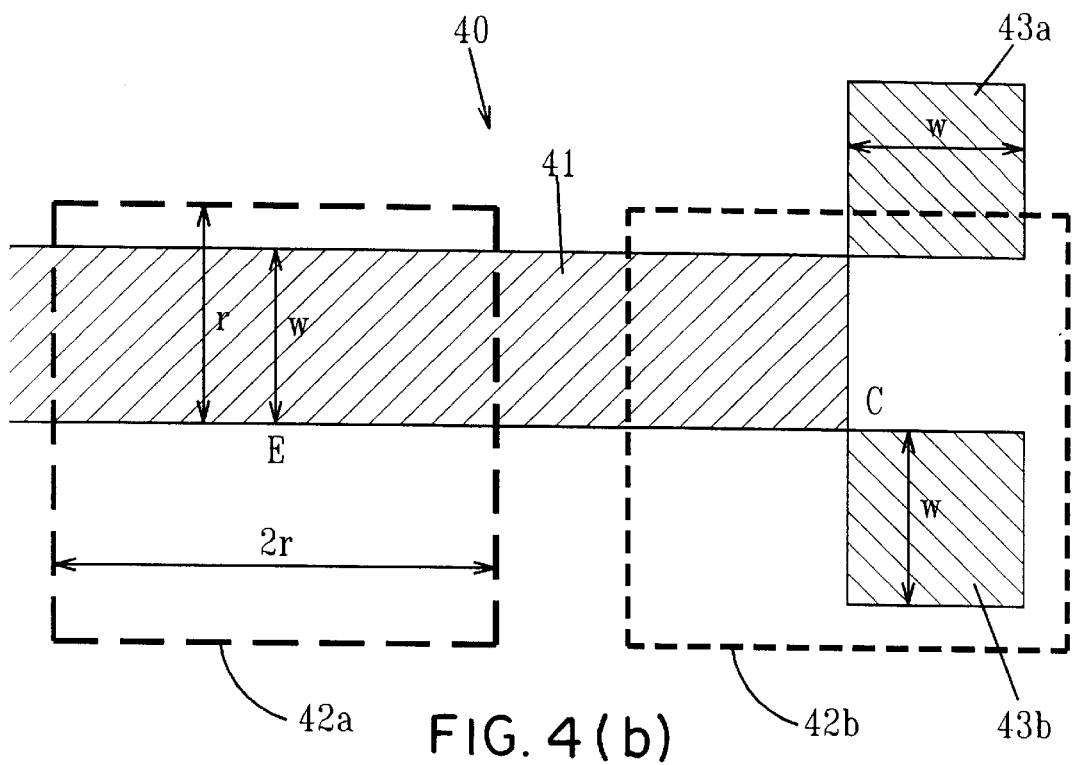
FIG. 4(b) depicts a serif design for a photomask line end portion to be illuminated by means including a square aperture for the case of w<r ≦2w.

FIG. 4(b) depicts a serif design 40 in a photomask line end portion 41 for illumination by means including a square aperture for the case where w<r≦2w. Hanging square serifs 43a,43b are of size w×w. It is understood that the masked areas (or unmasked areas) within kernel function representations 42a,42b in FIG. 4 are the same. More importantly, total volumes of 3D cone structures represented within clear regions of 2D squares 42a, 42b are equal, independent of the specific shape of kernel function K(x,y). This means equal aerial intensity (i.e., $I_C=I_E$) for both incoherent and coherent light illuminations, independent of the shape of their kernel function.

Figure 5:
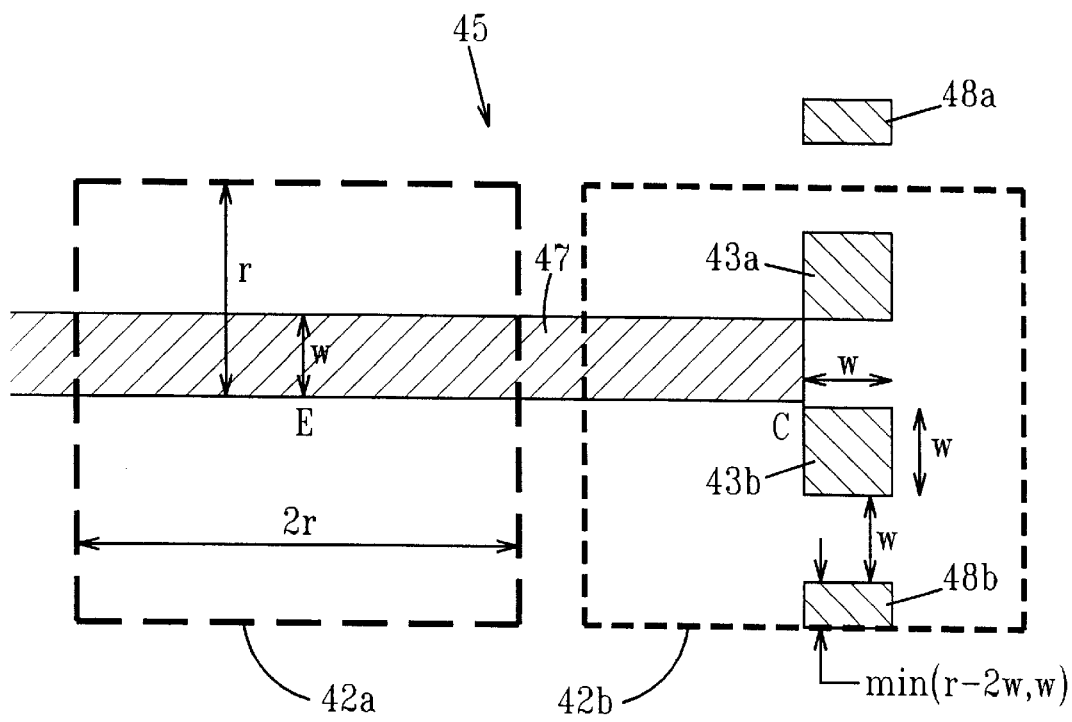
FIG. 5 depicts a serif design for a photomask line end portion to be illuminated by means including a square aperture for the case where 2w<r≦4w.

FIG. 5 depicts a serif design 45 in a photomask line end portion 47 for illumination by means including a square aperture for the case where 2w<r≦4w. In this example, there is provided hanging square serifs 43a, b, as in the example of FIG. 4(b), however, additionally there is provided respective disconnected serifs 48a, 48b, associated with a respective corner "C" of the wire 47. The first serifs 43a, 43b are the same as that in FIG. 4(b), i.e., squares of size w×w. The length of each disconnected serif 48a, 48b is w. The width of each disconnected serif 48a, 48b is the smaller of w and (r−2w), depending upon the kernel range r. As shown in FIG. 5, the distance between a hanging square serif, e.g., 43b, and its respective disconnected serif, e.g., 48b, is equal to the width w of the wire. It still holds true that the total volumes of 3D cone structures within clear regions of 2D squares 42a,42b are equal, independent of the specific shape of the kernel function K(x,y). Again, there is equal aerial intensity ($I_C=I_E$) for both incoherent and coherent light illuminations, independent of the shape of their kernel function.

Figure 6:
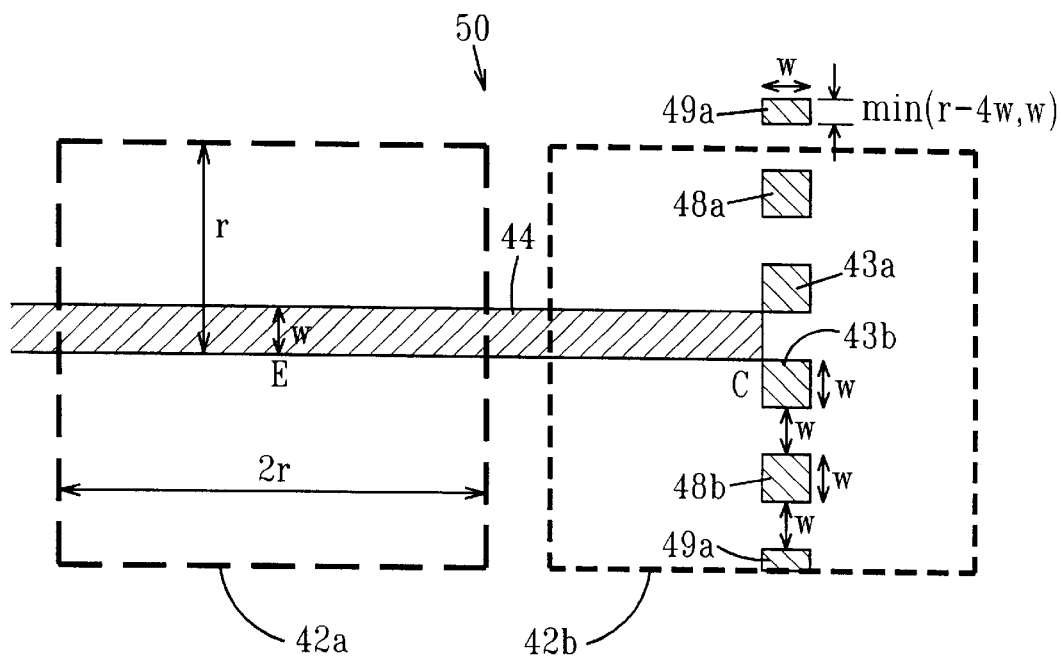
FIG. 6 depicts a serif design for a photomask line end portion to be illuminated by means including a square aperture for the case where 4w<r≦6w.

FIG. 6 depicts a serif design 50 in a photomask line end portion 44 for illumination by means including a square aperture for the case where 4w<r≦6w. In this example, there are three serifs associated with each corner of the wire: a first hanging square serif 43a (43b) of width w, and two additional disconnected square serifs 48a (48b) each of width w, and disconnected serifs 49a (49b) each of length w and width being the smaller of w and (r−4w) depending upon the kernel function's range r. As shown in FIG. 6, the distance between a disconnected square serif, e.g., 48b, and the second disconnected square serif, e.g., 49b, is equal to the width w of the wire. Once again, it still holds true that the total volumes of 3D cone structures within clear regions of 2D squares 42a,42b are equal and $I_C=I_E$ for both incoherent and coherent light illuminations, independent of the shape of their kernel functions.

In general, according to the invention, a serif design for a mask portion for illumination by means including a square aperture and wherein 2nw<r≦2(n+1) w, with n=1, 2, . . . , each corner has (n+1) disconnected serifs. Each of the first n serifs being of size w×w, and the (n+1)$^{th}$ serif being a rectangle of a length w and width min(r−2nw, w) and the distance between two adjacent serifs being w.

For the case of a circular aperture, each of serif designs shown in FIGS. 4–6 still gives equal aerial intensity $I_C=I_E$ for circular apertures under the same relationship between the kernel function's range r and wire width w. Under certain situations, the serif's shape may be optimized without changing aerial intensity $I_C$ at the corner (i.e., $I_{C=IE}$ is always maintained). That is, the serif's area may be reduced so that serif itself becomes less likely to show up in resist pattern.

Figure 7:
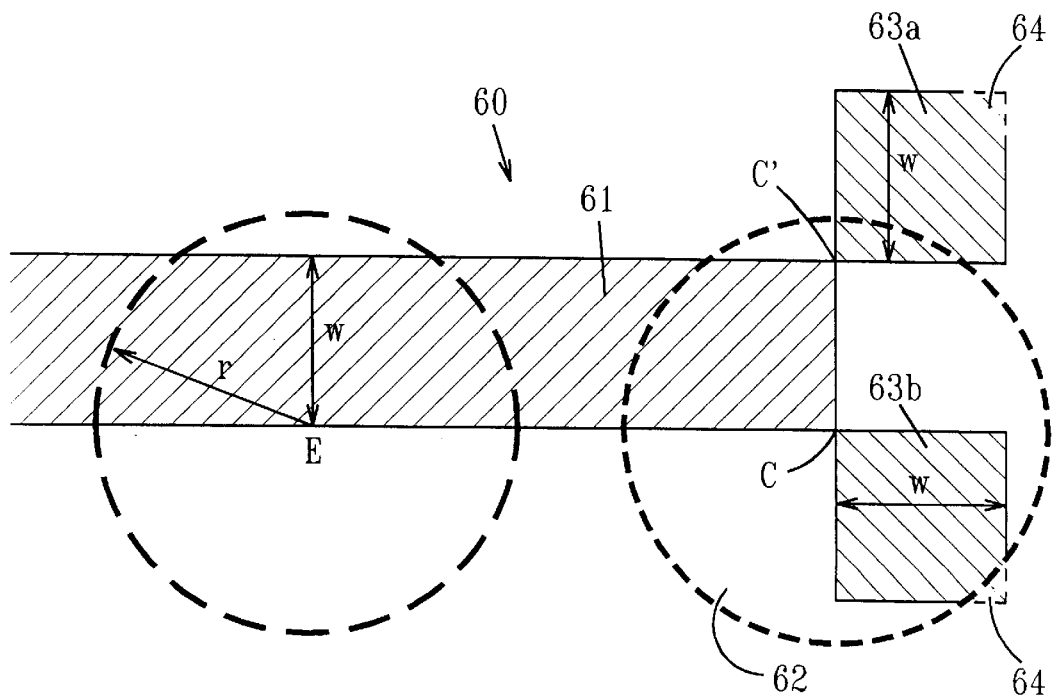
FIG. 7 depicts a serif design for a photomask line end portion to be illuminated by means including a circular aperture for the case where w<r<√2 w.

FIG. 7 depicts a serif design 60 in a photomask line end portion 61 for illumination by means including a circular aperture for the case where w<r<√2 w. In this embodiment, each hanging serif 63a, 63b has a shape comprising the intersection (a Boolean operation) of the original square serif 43a,b, respectively, of size w×w, with the kernel function representation at circular region 62 of radius r centered at each line corner C and C' respectively. Thus, with circle region 62 centered at point C, hanging serif 63b is intersected, and with circle region 62 centered at point C', hanging serif 63a is intersected, as shown in FIG. 7. Each of the intersected portions 64 of each hanging serif 63a,b may be cut-out without changing the resultant aerial image intensity at corners C and C', and thus maintaining $I_E=I_C$.

Figure 8:
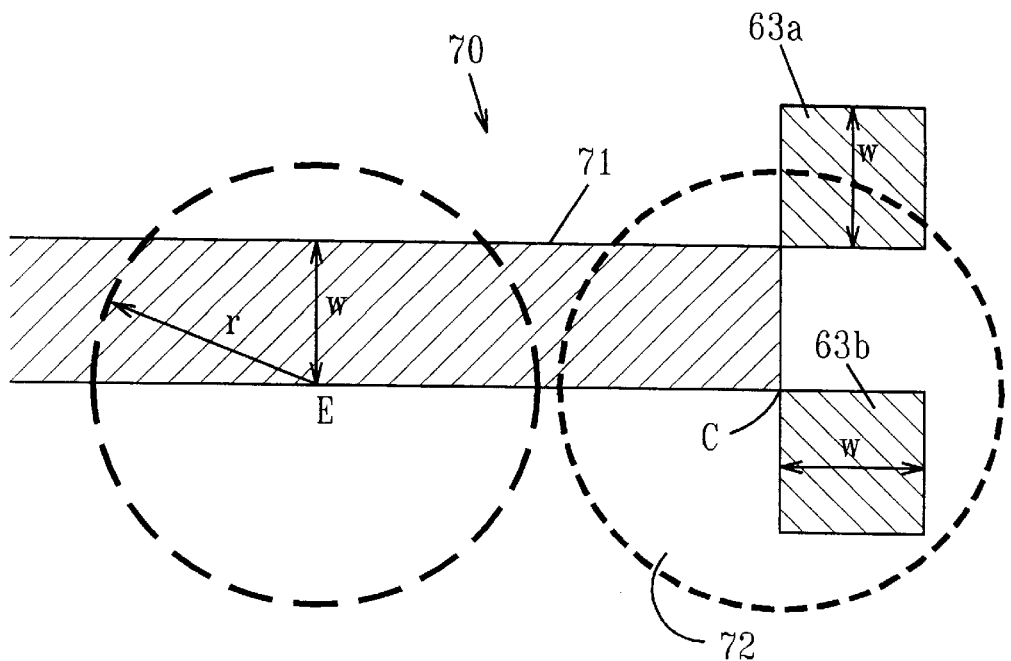
FIG. 8 depicts a serif design for a photomask line end portion to be illuminated by means including a circular aperture for the case where √2 w≦r≦2w.

FIG. 8 depicts a serif design 70 in a photomask line end portion 71 for illumination by means including a circular aperture for the case where √2 w≦r≦2w. In this embodiment, the 2D intensity/amplitude kernel function representation at circular region 72 of radius r which centers at the corner C does not cut off the original square serif 63b, thus rendering the serif design identical to that depicted in FIG. 4(b).

Figure 9:
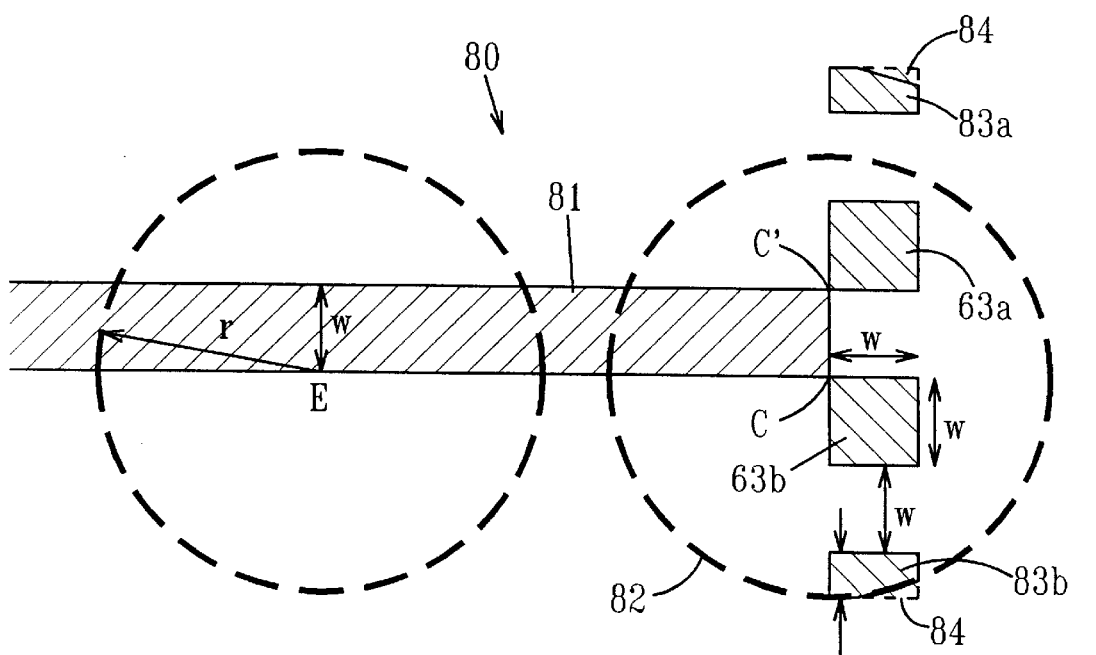
FIG. 9 depicts a serif design for a photomask line end portion to be illuminated by means including a circular aperture for the case where 2w<r<√10 w.

FIG. 9 depicts a serif design 80 in a photomask line end portion 81 for illumination by means including a circular aperture for the case where 2w<r<√10 w. In this embodiment, two hanging square serifs 63a, 63b, each of width w, are provided as in the case of FIG. 8. Additionally provided are disconnected serifs 83a, 83b aligned with respective hanging serifs 63a, 63b, and separated a distance w therefrom with each preferably of a length w and a width being the smaller of w and (r−2w) depending upon the kernel function's range r. Preferably, the shape of each outermost disconnected serif 83a, 83b comprises the intersection of the original rectangular serif of size w×min (r−2w,w) with the kernel function representation at circular region 82 of radius r centered at the corners C',C, respectively. Thus, as shown in FIG. 9, a portion 84 of each hanging serif 83a,b may be removed without changing the resultant aerial image intensity at corners C and C', and thus maintaining $I_E=I_C$. For the embodiment where √10 w ≦r≦4w, there is no cut-off (intersection of original rectangular serif of size w×min (r−2w,w) with the kernel function representation at circular region 82 of radius r) at the disconnected serif, and the serif design is exactly that as shown in FIG. 5.

FIG. 10 depicts a serif design 90 in a photomask line end portion 91 for illumination by means including a circular aperture for the case where 4w<r<√26 w. In this embodiment, there are three serifs associated with each corner of the line end: a first hanging square serif 63a (63b) of width w, and two additional disconnected square serifs 93a (93b) each of width w, and separated from a respective hanging serif by a distance w, and disconnected serifs 94a (94b) each of length w and width being the smaller of w and (r−4w) depending upon the kernel function's range r. The ideal shape of each outermost disconnected serif 94a, 94b is the intersection of the original rectangular serif of size w×min (r−4w,w) with the kernel function representation comprising circular region 92 of radius r which centers at the corners C, C', respectively. For the embodiment where √26 w≦r≦6w, there is no cut-off (intersection of original rectangular serif of size w×min (r−4w,w) with the kernel function representation at circular region 92 of radius r) at the disconnected serif, and the serif design is exactly that as shown in FIG. 6.

In general, when $2nw<r<[(2n+1)^2 +1]^{1/2}w$, with n=1, 2,..., the $(n+1)^{th}$ serif will be intersected and cut by a circle of radius r which centers at the corner C; when $[(2n+1)^2+1]^{1/2} w≦r≦2(n+1)w$, the $(n+1)^{th}$ serif will not be cut-off by the circle.

FIG. 11 illustrates a resultant aerial image/photoresist pattern 100 for the embodiment where w<r≦2w. In this embodiment, the serif mask design 110 including hanging serifs 102a,b and corresponding to the mask designs as depicted in FIG. 4(b) and FIG. 8, is employed. At one end 108 of the pattern line 109, there is no serif, and severe corner rounding and line end shortening is apparent. At the opposite end 107, the serif design shown in either FIGS. 4(b) and 8 is used, and the aerial image/resist pattern 100 passes through both corner points C and C' exactly.

FIG. 12 illustrates a resultant aerial image/photoresist pattern 120 for the embodiment where 3w<r≦4w. In this embodiment, the serif mask design 130 including hanging serifs 122a, ..., 122d and corresponding to the mask designs as depicted in FIG. 5 and FIG. 9, is employed. At one end 128 of the pattern line 129, there is no serif, and very severe corner rounding and line end shortening is clearly apparent. At the opposite end 127, the serif design shown in either FIG. 5 or FIG. 9 is used, and the aerial image/resist pattern 120 passes through both corner points C and C' exactly.

Figure 13:
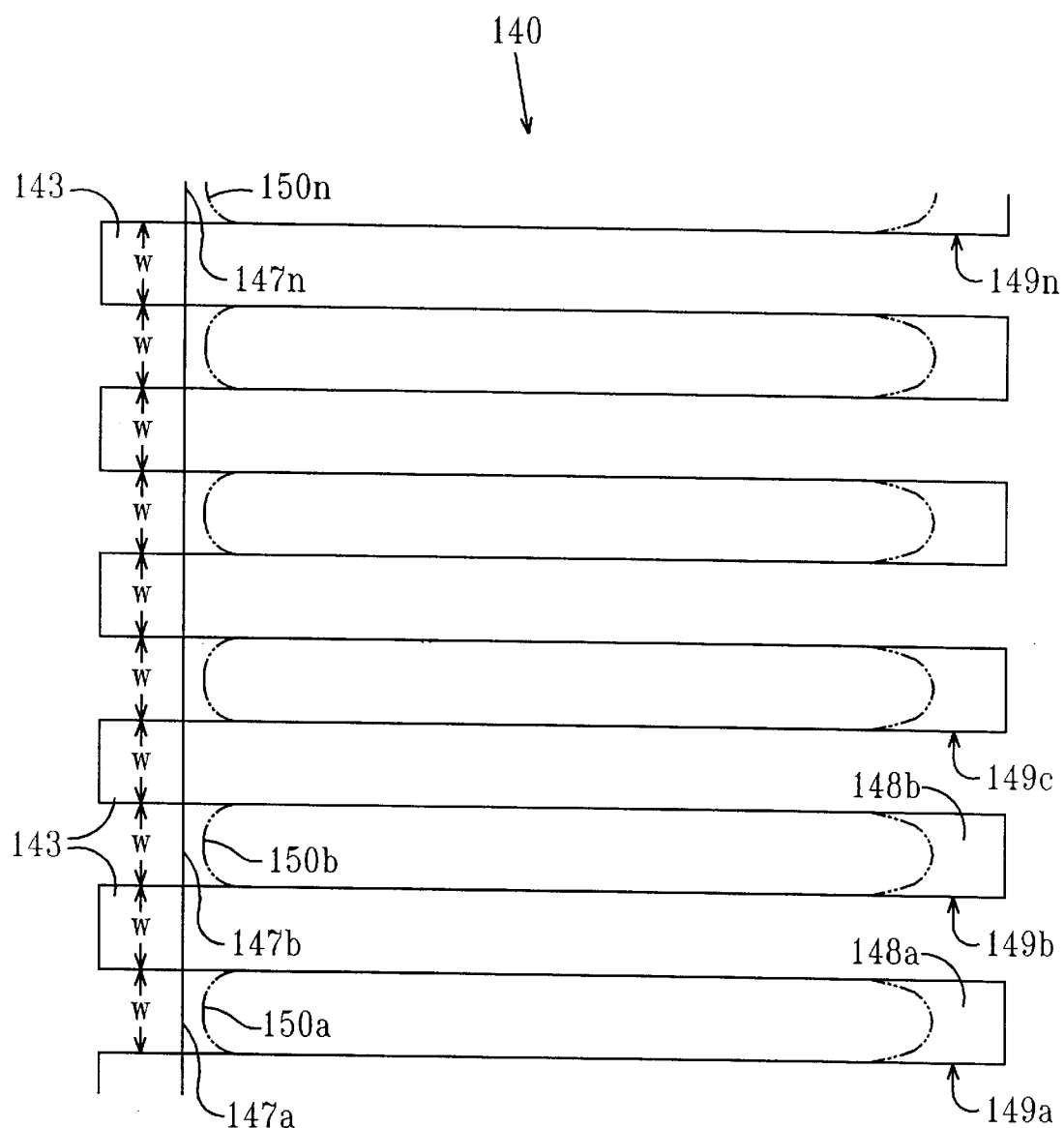
FIG. 13 illustrates a co-serif mask design between two neighboring lines 149a, . . . , 149n for the case of w<r≦2w and, a resultant aerial image/photoresist pattern.

FIG. 13 is an example of co-serif mask design 140 between two neighboring lines 149a, ..., 149n for the case of w<r≦2w. In the minimum-pitch wire/space array illustrated in FIG. 13, each wire track is occupied. The corresponding resulting aerial image/photoresist patterns 150a, ..., 150n are also displayed. At respective first ends 148a, ..., 148n of each the lines, there exists severe corner rounding and line end shortening of the resultant pattern 150. At each of the opposite ends 147a, ..., 147n of lines, both severe corner rounding and foreshortening are reduced significantly. Although $I_C$ is no longer equal to $I_E$ in FIG. 13, i.e., the neighboring line contributes more to an edge point than to a corner point, optimization of each serif's size, shape, and/or position may be carried out to achieve $I_C=I_E$. As shown in FIG. 13, each adjacent hanging serif 143 is separated by a distance w.

Figure 14:
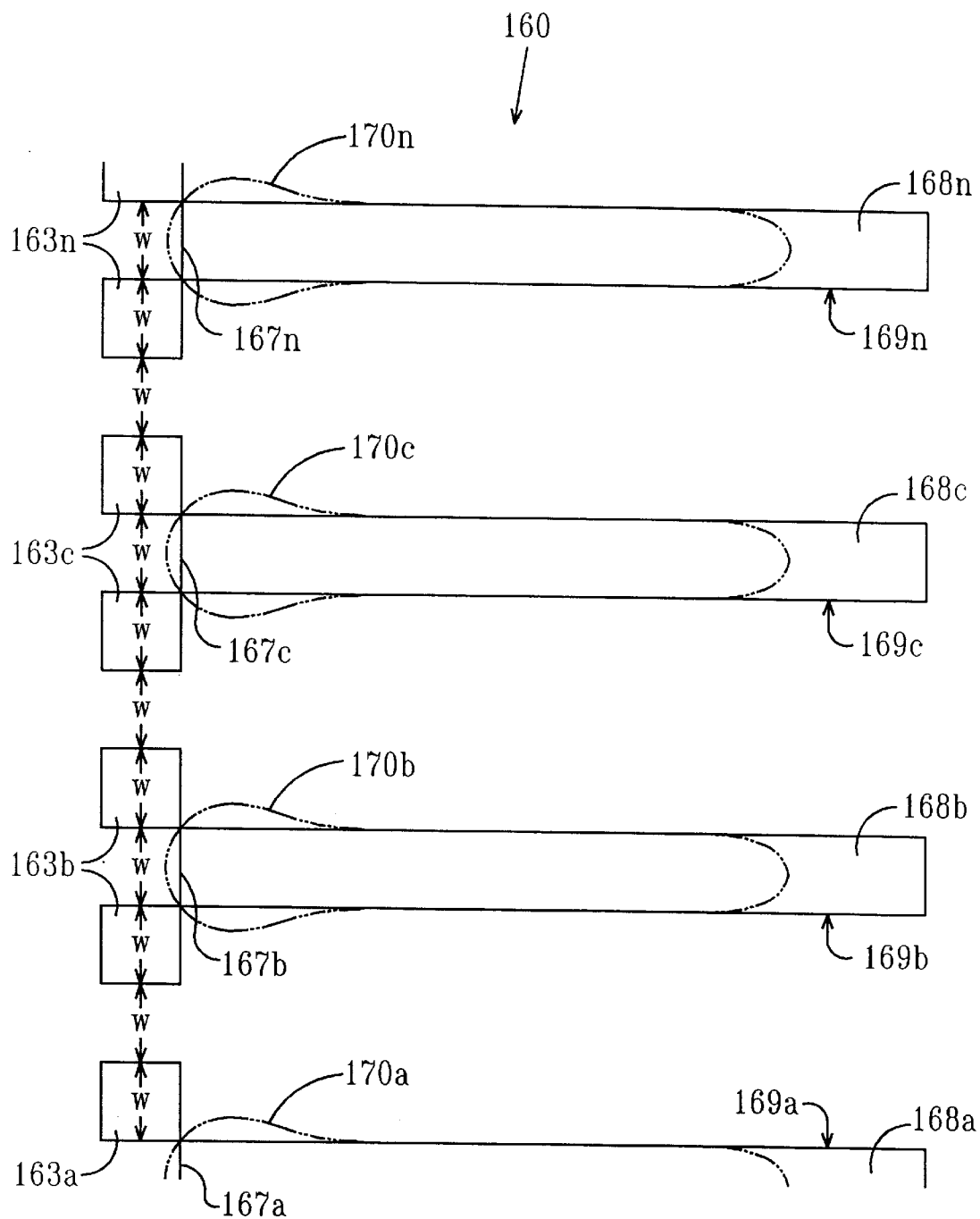
FIG. 14 illustrates another co-serif mask design between two neighboring lines 169a, . . . , 169n for the case of 2w<r≦4w and, a resultant aerial image/photoresist pattern.

FIG. 14 illustrates another co-serif mask design 160 between two neighboring lines 169a, ..., 169n for the case of 2w<r≦4w. In this embodiment, wire tracks in the minimum-pitch wire/space array are occupied alternatively. In FIG. 14, the corresponding resulting aerial image/photoresist patterns 170a, ..., 170n are also displayed. At respective first ends 168a, ..., 168n of each the lines, there exist severe corner rounding and line end shortening of the resultant pattern 170. At each of the opposite ends 167a, ..., 167n of the lines, severe foreshortening is corrected completely (with some over-correction) due to serifs located at the end of the line and the serif located at the near end of the adjacent tracks (See FIG. 5). That is, serif 163c of line 169c additionally contributes to the correction of corner rounding for the pattern 170b at line 169b. If 3w<r<4w, then $I_C$ and $I_E$ are not exactly equal, but the difference between them is very small such that the curve of aerial image/resist pattern nearly passes through corner points C and C' at each opposite end 167. As shown in FIG. 14, each adjacent hanging serif is separated by a distance w.

While the invention has been particularly shown and described with respect to illustrative and preferred embodiments thereof, it will be understood by those skilled in the art that the forgoing and other changes in form and detail may be made therein without departing from the spirit and scope of the invention which should be limited only by the scope of the appended claims.

What is claimed is:

1. A method for designing a photolithographic mask pattern including serifs for correcting severe corner rounding and line end foreshortening effects occurring in a line-end portion of a microlithographic circuit as a result of a photolithographic process, said method including:

modeling aerial image intensity or final photoresist pattern for said photolithographic process as a convolution or the square of a convolution between said mask and an intensity/amplitude kernel function having an effective range r in x and y directions;

designing said mask to include a line end portion of a width w and including an edge defining two corners for illumination by an imaging system during said photolithographic process, each corner having an associated corner region outside said line-end portion for locating of one or more serifs, whereby for closely spaced lines in said mask, said serif functions as a co-serif of two or more nearby wire lines.

2. The method as claimed in claim 1, further including representing, for implementation of spatially incoherent illumination or partial coherent illumination with large coherence factor σ, an aerial image intensity or photoresist pattern of the lithographic process as a convolution between said mask and an intensity kernel function having an effective range r.

3. The method as claimed in claim 1, further including representing, for implementation of spatially coherent illumination or partial coherent illumination with small coherence factor σ, an aerial image intensity or photoresist pattern of the lithographic process as the square of a convolution between said mask and an amplitude kernel function having an effective range r.

4. The method as claimed in claim 1, further including modeling said effective range r as a function of the wavelength λ of the illumination light, a numerical aperture "NA" of the imaging system, and a coherence factor σ, and one of: modeling said effective range r on the order of λ/NA, or modeling said effective range r based on a range of optical proximity effects.

5. The method as claimed in claim 1, further including modeling an intensity/amplitude kernel function $K(x, y)$ as having symmetry according to: $K(x, y)=K(|x|, |y|)=K(y, x)$, where $x=y=0$ represents a center of said kernel function.

6. The method as claimed in claim 1, wherein each respective corner region is an area defined between lines extending from each corner of said end line portion.

7. The method as claimed in claim 1, wherein for a condition that $w<r<2w$, providing a hanging square serif of a size $w \times w$ within a corner region attached to a respective corner at a single point.

8. The method as claimed in claim 1, wherein for a condition of $2nw<r \leq 2(n+1)w$, with $n=1, 2, \ldots$, designing each said corner region of said line end portion to include an associated (n+1) serifs, each of the first n serifs being square and of a width w, and the $(n+1)^{th}$ serif being a rectangle of a length w and width $\min(r-2nw, w)$.

9. The method as claimed in claim 8, wherein within each corner region, each of said (n+1) associated serifs are linearly aligned along line-end extension line and spaced apart from an adjacent serif by a distance w, a first said serif being a hanging serif connected to said corner at one point only.

10. The method as claimed in claim 1, further including the step of modeling the intensity/amplitude kernel function as being azimuthal-angle independent and being non-zero over a circular area of radius r when implementing a circular aperture, said method further including the step of further optimizing the serif design without affecting the aerial image intensity at the corner.

11. The method as claimed in claim 10, wherein for a condition of $\max (2nw, w)<r<[(2n+1)^2+1]^{1/2}w$, with $n=0, 1, 2, \ldots$, drawing a circular area of radius r with its center at the respective corner, which represents said intensity/amplitude kernel function, said circle intersecting the (n+1)th serif in respective corner region.

12. The method as claimed in claim 11, wherein said $(n+1)^{th}$ serif intersected by a intensity/amplitude kernel function circular area of radius r which centers at a corner defines a portion to be removed from said serif.

13. The method as claimed in claim 12, wherein for an instance when $[(2n+1)^2+1]^{1/2} w \leq r \leq 2(n+1)w$, the (n+1)th serif is not intersected by said intensity/amplitude kernel function circular area.

14. The method as claimed in claim 1, including the step of locating said serifs between two or more neighboring wire tracks in a minimum-pitch wire/space array of a photolithographic circuit, wherein each wire track is occupied, said serifs providing optical proximity correction for those neighboring wires and comprise co-serifs of said two or more neighboring wires.

15. The method as claimed in claim 14, including the step of locating said serifs between two or more neighboring tracks in a minimum-pitch wire/space array of a photolithographic circuit, wherein alternating wire tracks are occupied, said serifs providing optical proximity correction for those neighboring wires and comprise co-serifs of said two or more neighboring wires.

16. A photolithographic mask for conducting a light source onto a semiconductor surface during a photolithographic process, said mask including a line end portion for illumination by an imaging system, wherein an aerial image intensity or final photoresist pattern for said photolithographic process is modeled as a convolution or the square of a convolution between said mask and an intensity/amplitude kernel function having an effective range r in x and y directions, said line end portion having a width w and including two corners each defining a respective corner region being an area defined between lines extending from each corner of said end line portion for locating one or more serifs therein for correcting severe corner rounding and line end foreshortening effects caused by said mask during said photolithographic process, whereby for closely spaced lines, a serif functions as a co-serif of two or more nearby wire lines.

17. The photolithographic mask as claimed in claim 16, wherein for a condition that $w<r<2w$, providing a hanging square serif of a size $w \times w$ attached to a respective corner within a corner region at a single point only.

18. The photolithographic mask as claimed in claim 16, wherein for a condition of $2nw<r \leq 2(n+1)w$, with $n=1, 2, \ldots$, each said corner region of said line end portion includes an associated (n+1) serifs, each of the first n serifs being square and of a width w, and the $(n+1)^{th}$ serif being a rectangle of a length w and width $\min(r-2nw, w)$.

19. The photolithographic mask as claimed in claim 18, wherein within each corner region, each of said (n+1) associated serifs are linearly aligned along a line-end extension line and spaced apart from an adjacent serif by a distance w, said first serif being a hanging serif connected to said corner at one point.

20. The photolithographic mask as claimed in claim 16, wherein said imaging system includes a light source device having a square or circular aperture.

21. The photolithographic mask as claimed in claim 17, wherein for an imaging system including a light source device including a circular aperture wherein the intensity/amplitude kernel function is modeled as being azimuthal-angle independent and being non-zero over a circular area of radius r, a hanging square serif of size w×w is optimized without affecting the aerial image intensity at the corner.

22. The photolithographic mask as claimed in claim 18, wherein for an imaging system including a light source device including a circular aperture wherein the intensity/amplitude kernel function is modeled as being azimuthal-angle independent and being non-zero over a circular area of radius r, a hanging square serif of size w×w and the associated (n+1) serifs are optimized without affecting the aerial image intensity at the corner.

23. The photolithographic mask as claimed in claim 22, wherein for a condition of max (2nw, w)<r<$[(2n+1)^2+1]^{1/2}$ 2w, with n=0, 1, 2, . . . , each said corner region includes an associated (n+1) serifs, each of the first n serifs being square and of a size w×w, and the (n+1) serif in each corner region being intersected by said intensity/amplitude kernel function of circular area of radius r when centered at its respective corner.

24. The photolithographic mask as claimed in claim 23, wherein said $(n+1)^{th}$ serif intersected by a intensity/amplitude kernel function circular area of radius r which centers at a corner defines a portion to be removed from said serif.

25. The photolithographic mask as claimed in claim 24, wherein for an instance when $[(2n+1)^2+1]^{1/2}$ w≦r≦2(n+1) w, the $(n+1)^{th}$ serif is not intersected by said intensity/amplitude kernel function circular area.

26. The photolithographic mask as claimed in claim 16, applied between two or more neighboring tracks in a minimum-pitch wire/space array of a photolithographic circuit, wherein each wire track is occupied, said serif mask providing optical proximity correction for those neighboring wires and comprise co-serifs of said two or more neighboring wires.

27. The photolithographic mask as claimed in claim 16, applied between two or more neighboring tracks in a minimum-pitch wire/space array of a photolithographic circuit, wherein alternating tracks are occupied, said serif mask providing optical proximity correction for those neighboring wires and comprising co-serifs of said two or more neighboring wires.

* * * * *

UNITED STATES PATENT AND TRADEMARK OFFICE
CERTIFICATE OF CORRECTION

PATENT NO. : 6,127,071
DATED : October 3, 2000
INVENTOR(S) : Ning Lu

Page 1 of 1

It is certified that error appears in the above-identified patent and that said Letters Patent is hereby corrected as shown below:

Column 5,
Line 45, "w<r>2w" should read -- $w < r \leq 2w$ --

Column 11, claim 23,
Line 20 and 21, "½w" should read -- $^{1/2}w$ --
Line 23, "(n+1)" should read -- $(n+1)^{th}$ --

Signed and Sealed this

Twenty-third Day of October, 2001

Attest:

NICHOLAS P. GODICI

*Attesting Officer*   *Acting Director of the United States Patent and Trademark Office*